United States Patent [19]

Saari

[11] 4,429,282
[45] Jan. 31, 1984

[54] OFFSET-NULLED SAMPLE-AND-HOLD AMPLIFIER

[75] Inventor: Veikko R. Saari, Spring Lake Heights, N.J.

[73] Assignee: Bell Telephone Laboratories, Incorporated, Murray Hill, N.J.

[21] Appl. No.: 346,643

[22] Filed: Feb. 8, 1982

[51] Int. Cl.³ .............................................. H03F 1/00
[52] U.S. Cl. ......................................... 330/9; 330/51; 328/162
[58] Field of Search ............................ 330/9, 51, 107; 328/162, 165

[56] References Cited

U.S. PATENT DOCUMENTS

| | | | |
|---|---|---|---|
| 3,801,919 | 4/1974 | Wilkes et al. | 330/9 |
| 4,255,715 | 3/1981 | Cooperman | 330/9 |
| 4,306,196 | 12/1981 | Dwarakanath et al. | 330/9 |

*Primary Examiner*—James B. Mullins
*Assistant Examiner*—Steven J. Mottola
*Attorney, Agent, or Firm*—Volker R. Ulbrich

[57] ABSTRACT

A high performance operational amplifier 12 circuit 10 nulls the offset voltage by means of switched capacitors ($C_2$, $C_3$) and holds the signal output 18 during the nulling. Switching is in response to two non-overlapping pulse trains $\phi_1$, $\phi_2$. During an output valid phase $\phi_1$, with the signal input source connected to the inverting input 14 of the amplifier 12, an offset voltage storage capacitor $C_2$ is connected between the non-inverting input 16 and ground. A signal storage capacitor $C_3$ is connected between the output 18 and ground. During a nulling phase $\phi_2$, the signal storage capacitor $C_3$ is disconnected from ground and connected between the output 18 and the inverting input 14. The previously grounded side of the offset voltage storage capacitor $C_2$ is switched to the inverting input port 14. The non-inverting input port 16 is grounded. The offset storage capacitor $C_2$ charges to the input offset voltage, while the inverting input 14 is reset to virtual ground. When the circuit 10 is reconnected in the $\phi_1$ valid output phase, the offset is compensated by the input offset storage capacitor $C_2$ without the output 18 having been directly connected to the inverting input 14. This makes possible a shorter settling time.

Also disclosed as optional is an output offset limiting feedback network 35 for preventing a locking of the circuit 10 which can result from excessive initial offset voltage and a capacitor $C_4$ connected between the input side of the signal hold capacitor $C_3$ and the inverting input 14 to prevent sensitivity to clock leakage.

4 Claims, 3 Drawing Figures

OFFSET-NULLED SAMPLE-AND-HOLD AMPLIFIER

FIELD OF THE INVENTION

The invention relates generally to offset voltage nulling circuits for operational amplifiers, and more particularly to such amplifiers designed for large scale integrated circuits.

BACKGROUND OF THE INVENTION

Operational amplifiers develop an offset voltage $V_{offset}$ during their operation. This offset voltage is the voltage appearing between the inverting and the non-inverting input ports when the output is near zero. It is caused by substantially unavoidable internal component mismatches. Its effect is to introduce an error in the output signal voltage level. This problem is of particular significance for high performance amplifiers, which are characterized by high gain, high stability, low noise and wide band capability, because the offset voltage undergoes at least as great a gain as the signal and therefore increases in severity with increasing gain.

The general approach to dealing with the offset voltage has been to periodically reset the amplifier during a nulling phase by connecting the output to the inverting input. This type of arrangement is described, for example, in U.S. Pat. No. 4,306,196 issued Dec. 15, 1981 to Dwarakaneth et. al. and assigned to the assignee of the present application. However, this type of resetting has the disadvantage that if the output is returned to zero during nulling, it must thereafter be driven back to the appropriate signal level. This degrades the settling time of the amplifier, especially if it is driving a capacitive load or if significant clock leakage is present.

One approach to compensating for offset voltage with minimum degradation in performance is by the use of circuits such as are described in U.S. Pat. No. 3,801,919 issued Apr. 2, 1974 to Wilkes et al. and U.S. Pat. No. 4,255,715 issued Mar. 10, 1981 to Cooperman. These circuits involve filtering the dc (direct current) level of the output on a continuous basis and using that level as a reference for continuously adjusting the offset compensation at the inputs. Such filtering arrangements require relatively complex circuitry.

SUMMARY OF THE INVENTION

The amplifier circuit of the present invention is so arranged that the output is sampled during one clock phase $\phi_1$ and held in another phase $\phi_2$ while the offset voltage is nulled. The settling time is not significantly degraded. The nulling circuit is a switched capacitor type which requires no filtering in the feedback path. It is of relatively low complexity and requires little area on an integrated circuit chip.

DETAILED DESCRIPTION

Figure 1:
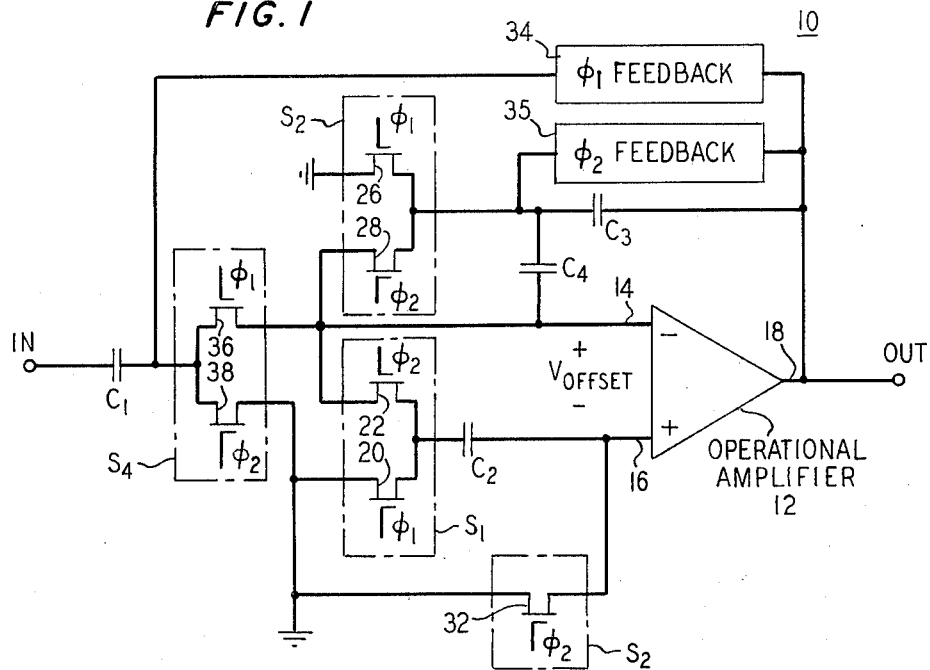
FIG. 1 is a simplified schematic circuit diagram of a switched capacitor amplifier circuit in accordance with one example of the invention.

The amplifier circuit 10 of FIG. 1 includes an operational amplifier 12 having an inverting input port 14, a non-inverting input port 16, and an output port 18. A signal is provided to the circuit 10 via an input network represented here by an input capacitor $C_1$. The input network may include switched capacitors. Connected to one side of the non-inverting input port 16 is an offset voltage storage capacitor $C_2$. A first switch $S_1$ is connected to the other side of the offset voltage storage capacitor $C_2$ to connect it to a ground potential reference voltage in response to 100 1 pulses of a first, valid output phase electrical pulse train $\phi_1$ and to connect it to the inverting input port 14 in response to $\phi_2$ pulses of a second, offset nulling phase electrical pulse train $\phi_2$, which is non-overlapping with the first pulse train $\phi_1$. The first switch $S_1$ is made up of two FET's (field effect transistors) 20, 22, which have their gates addressed respectively by the pulse trains $\phi_1$, $\phi_2$ from an appropriate pulse train source, which is not shown.

A signal hold capacitor $C_3$ is connected at one, output side to the output port 18. A second switch $S_2$ connects the other, input side of the signal hold capacitor $C_3$ to ground in response to the first pulse train $\phi_1$ and to the inverting input port 14 in response to the second pulse train $\phi_2$. The second switch $S_2$ is likewise an arrangement of two FET's 26, 28 with the common node connected to the input side of the signal hold capacitor $C_3$ and with their gates likewise operated respectively by the pulse trains $\phi_1$, $\phi_2$.

A third switch $S_3$, which is shown as a single FET 32, but which may include clock leakage compensation, connects the non-inverting port 16 to ground in response to the second pulse train $\phi_2$ and is open during phase $\phi_1$ in the absence of the $\phi_1$ pulses of the first pulse train $\phi_1$.

A $\phi_1$ feedback network 34 is connected at one, output side to the output port 18 and at the other, input side to a common node of a fourth switch $S_4$ formed by a pair of FET's 36, 38 respectively responsive to the pulse trains $\phi_1$, $\phi_2$. The fourth switch $S_4$ connects the input side of the $\phi_1$ feedback network 34 to the inverting input port 14 in response to the first pulse train $\phi_1$ and to ground potential in response to the second pulse train $\phi_2$. The common node of the transistors 36, 38 of the fourth switch $S_4$ is connected to the amplifier side of the input network (represented by input capacitor $C_1$). Another capacitor $C_4$ is connected between the input side of the signal hold capacitor $C_3$ and the inverting input port 14 to maintain negative feedback during the non-overlapping period between the two pulse trains $\phi_1$, $\phi_2$ to prevent sensitivity to clock leakage. The capacitor $C_4$ is desirable, but not essential to practicing the invention. A $\phi_2$ feedback network is connected at one, output side to the output port 18 and at its other, input side to the input side of the signal hold capacitor $C_3$. The nature of both the $\phi_1$ and $\phi_2$ feedback networks will be discussed below.

Figure 2:
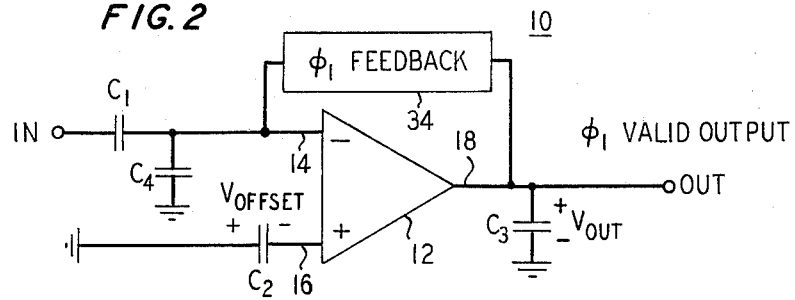
FIG. 2 is a schematic circuit diagram showing in reconfigured form the equivalent circuit for the active portions of the circuit of FIG. 1 in a $\phi_1$ first, valid output phase condition.
Figure 3:
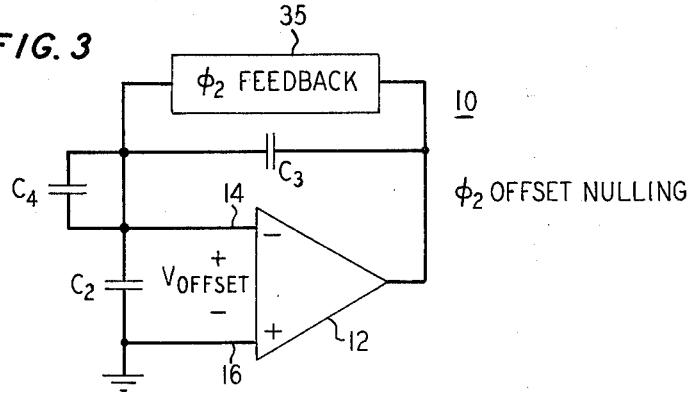
FIG. 3 is a simplified schematic circuit diagram showing in reconfigured form the equivalent circuit for the active portions of the circuit of FIG. 1 in a second, $\phi_2$ offset voltage nulling phase condition.

For describing the operation of amplifier circuit 10, it is useful to refer to FIGS. 2 and 3, which are reconfigured, simplified versions of the circuit 10 of FIG. 1 in which inactive portions are respectively eliminated for each of the phases $\phi_1$, $\phi_2$ to minimize unnecessary detail.

FIG. 2 shows the circuit 10 in the $\phi_1$ valid output condition in which a normal signal output corresponding accurately to the input signal from the input capacitor $C_1$ appears at the output port 18. The output signal level $V_{out}$ appears across the capacitor $C_3$.

The $\phi_1$ network provides negative feedback of the signal from the output port 18 for determining the transmission characteristics of the operational amplifier 12 in the $\phi_1$ phase. Negative feedback networks for operational amplifiers are well known, and the particular features of the $\phi_1$ feedback network, which may contain switched capacitors, are therefore not described in further detail here.

When the switches $S_1$, $S_2$, $S_3$, $S_4$ are now operated by the pulse trains to the $\phi_2$ condition, the resulting circuit is that of FIG. 3. The offset voltage storage capacitor $C_2$ is now connected across the inputs 14, 16, the non-inverting input port 16 is grounded. The signal hold capacitor $C_3$ is disconnected from its ground and connected to the inverting input port 14. In this condition, the grounded side of the offset voltage storage capacitor $C_2$ pulls the non-inverting input port 16 to a voltage equal in magnitude to the offset voltage. Negative feedback through the signal hold capacitor $C_3$ forces the inverting input port 14 to its normal virtual ground potential level, if it is not already there.

It can be seen that when the amplifier 10 now returns to the $\phi_1$ valid condition, the output voltage starts at substantially the same value which it had at the end in the previous $\phi_1$ phase period, differing only due to the effect of the small amount of charge which may have been necessary to adjust the offset compensating voltage on the offset voltage storage capacitor $C_2$ during the previous $\phi_2$ condition. Under normal circumstances, the offset voltage level changes much more slowly then does the signal voltage level. Therefore, this change in the value of the held signal is for all practical purposes insignificant compared to the change that will now result due to an increment in the input signal voltage. The offset voltage storage capacitor $C_2$, when connected back to ground at its other side in the $\phi_1$ valid output condition, provides the offset voltage compensation for that phase.

The $\phi_2$ feedback network 35 acts in the $\phi_2$ nulling phase to prevent the magnitude of the initial output offset voltage of the amplifier 12 from exceeding a value which would be too great for the amplifier 12 to remain within the limits of its permissible operating range. This prevents the amplifier 12 from locking the circuit 10 into a zero-gain state. In such a state there can be no offset nulling action, since no voltage change can occur at the output port 18. In order to limit the initial output offset voltage, the $\phi_2$ feedback network 35 clips the output at a level inside the inherent clipping thresholds (limits) of the amplifier 12. Clipping circuits for performing such a function are well known, and therefore the particular features of the $\phi_2$ feedback network 35 are not described in further detail here.

For some applications of the circuit 10 the excessive initial offset voltage problem does not present itself, and the $\phi_2$ feedback network 35 may then be eliminated entirely. Since the offset voltage changes at a relatively slow rate, it would also be feasible to limit the output signal swing with nonlinear negative feedback during the $\phi_1$ phase by appropriately modifying the $\phi_1$ feedback network.

It is an important feature of the circuit 10 that the output port 18 is never connected directly to the inverting input port 14 and therefore is never forced to substantially zero output in the nulling phase $\phi_1$. The feedback in this phase is provided by the signal hold capacaitor $C_3$. No complex filter circuit structure is required in this feedback path. Also, since the output of the amplifier 12 is not returned to zero for each nulling operation, but rather is kept at the signal output level of the previous $\phi_1$ valid output condition, the settling time of the amplifier is not significantly effected by the entire process of offset voltage nulling. Relative to the signal, the pulse trains $\phi_1$, $\phi_2$ are a high enough frequency, here about 112 kHz, that for all practical purposes the offset voltage compensation is provided on a substantially continous basis.

GENERAL CONSIDERATIONS

It is significant that only two pulse trains $\phi_1$, $\phi_2$ are required for operating the switches $S_1$, $S_2$, $S_3$, $S_4$. It is also an important feature of the circuit 10 that points of application of the input signal and ground can be interchanged. Where the signal input network does not include a capacitor, such as the capacitor $C_1$ of the circuit 10, then the signal input may be continuous, without the necessity of being periodically grounded.

While the switches $S_1$, $S_2$, $S_3$, $S_4$ of the circuit 10 are intended to be configured for a judicious compromise between circuit complexity and smooth behavior, it will be apparent to those of ordinary skill in the art of switched-capacitor circuit designs that there are other switching arrangements by which the appropriate connections for the two phases $\phi_1$, $\phi_2$ can be obtained. Various of the switching functions of the switches $S_1$, $S_2$, $S_3$, $S_4$ can be shared or provided by other, additional switches.

What is claimed is:

1. An amplifier circuit including an operational amplifier having an inverting input port, a non-inverting input port and an output port, said circuit comprising a switched capacitor offset voltage compensation network to compensate for the voltage offset of said operational amplifier, said network being CHARACTERIZED BY:
   an offset voltage storage capacitor, one side of which is connected at said non-inverting input port;
   means for connecting the other side of said offset voltage storage capacitor to a reference voltage in response to a first electrical pulse train and to said inverting input port in response to a second electrical pulse train, non-overlapping said first pulse train;
   a signal hold capacitor connected at a first, output side to said output port;
   means for connecting the other, input side of said signal hold capacitor to said reference potential in response to said first pulse train and to said inverting input port in response to said second pulse train;
   means for connecting said non-inverting input port to said reference potential in response to said second pulse train and disconnecting said non-inverting input port from said reference potential in the absence of the pulses of said second pulse train; and
   means for providing a signal input to said inverting input port.

2. The circuit defined in claim 1 comprising a capacitor connected between said inverting input port and said input side of said signal hold capacitor.

3. The circuit defined in claim 1 comprising a feedback network which in response to at least one of said pulse trains is connected between said inverting input port and said output port of said operational amplifier to limit the output offset of said operational amplifier.

4. The circuit defined in claim 3 comprising a capacitor connected between said inverting input port and said input side of said signal hold capacitor.

* * * * *